United States Patent
He et al.

(10) Patent No.: US 8,952,297 B2
(45) Date of Patent: Feb. 10, 2015

(54) REACTION APPARATUS FOR PROCESSING WAFER, ELECTROSTATIC CHUCK AND WAFER TEMPERATURE CONTROL METHOD

(75) Inventors: Qiyang He, Beijing (CN); Yiying Zhang, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 439 days.

(21) Appl. No.: 13/351,741

(22) Filed: Jan. 17, 2012

(65) Prior Publication Data

US 2013/0126509 A1     May 23, 2013

(30) Foreign Application Priority Data

Nov. 18, 2011   (CN) .......................... 2011 1 0369058

(51) Int. Cl.
  *F27B 5/14*       (2006.01)
  *H01L 21/67*      (2006.01)
  *H01L 21/683*     (2006.01)
  *H05B 1/00*       (2006.01)

(52) U.S. Cl.
  CPC .... *H01L 21/67115* (2013.01); *H01L 21/67248* (2013.01); *H01L 21/6831* (2013.01)
  USPC ............ 219/390; 219/209; 392/416; 118/728

(58) Field of Classification Search
  CPC ............ H01L 1/67115; H01L 1/67248; H01L 1/6831; H01L 1/67; H01L 1/683; H01L 1/68332
  See application file for complete search history.

(56) References Cited

U.S. PATENT DOCUMENTS

2011/0061810 A1*  3/2011  Ganguly et al. ......... 156/345.27
2013/0052834 A1*  2/2013  Kielwein et al. .............. 438/758

* cited by examiner

*Primary Examiner* — Shawntina Fuqua
(74) *Attorney, Agent, or Firm* — Koppel, Patrick, Heybl & Philpott; Michael J. Ram

(57) ABSTRACT

This invention discloses a reaction apparatus for wafer treatment, an electrostatic chuck and a wafer temperature control method, in the field of semiconductor processing. The electrostatic chuck comprises an insulating layer for supporting a wafer and a lamp array disposed in the insulating layer. Each lamp of the lamp array can be independently controlled to turn on and off and/or to adjust the output power. By controlling the on/off switch and/or output power of each lamp of the lamp array the temperature of the wafer held on the ESC is adjusted and temperature non-uniformity can be more favorably adjusted, greatly improving wafer temperature uniformity, particularly alleviating non-radial temperature non-uniformity.

21 Claims, 10 Drawing Sheets

REACTION APPARATUS FOR PROCESSING WAFER, ELECTROSTATIC CHUCK AND WAFER TEMPERATURE CONTROL METHOD

CROSS-REFERENCE TO RELATED APPLICATIONS

This application claims priority to Chinese Patent Application No. 201110369058.X, filed on Nov. 18, 2011 and entitled "REACTION APPARATUS FOR PROCESSING WAFER, ELECTROSTATIC CHUCK AND WAFER TEMPERATURE CONTROL METHOD", which is incorporated herein in its entirety by reference.

BACKGROUND OF THE INVENTION

1. Field of the Invention

The present invention relates to the field of semiconductor production, particularly to a reaction apparatus for wafer treatment, an electrostatic chuck (ESC) and a wafer temperature control method.

2. Description of the Related Art

The wafer (such as silicon wafer) is a foundational semiconductor material for die fabrication, and is also the most important material in the semiconductor industry. The final quality of dies produced from wafers is directly influenced by the quality of wafers initially employed in their fabrication. If initial wafers are defective, dies produced therefrom will inevitably have some defects. Thus, strict material and physical requirements must be maintained for wafers that can be employed in semiconductor device fabrication.

Cost is also a critical factor in the semiconductor industry. From the perspective of cost, modern semiconductor techniques seek on one hand to reduce the physical size of devices produced from wafers, and on the other hand make great efforts to enlarge wafer size, both of which are intended to produce more dies at approximately the same costs. With the development of larger wafers, for example 5 inch, 8 inch and now 12 inch, and a next generation with 18 inch or even larger sizes, various new issues arise.

Uniformity control is an important aspect in wafer processes. The larger the size of the wafers, the more critical the uniformity control; uniformity control has become a major challenge in the development of those processes.

An ESC cooling system is an important means used in wafer temperature uniformity control. Existing ESC cooling systems employ a ring type multi-zone design, which can provide different temperatures for different cooling zones to adjust the temperature uniformity of the wafers. Such designs can favourably adjust for radial temperature non-uniformity. However, such existing ESC designs are unable to provide appropriate adjustment of temperature non-uniformity in the non-radial direction. FIG. 1A-FIG. 1C show an adjustment result for non-uniform temperature distribution of the existing ESC design, wherein FIG. 1A shows a greyscale temperature distribution (C.°) across a wafer to be treated, FIG. 1B shows a tuned distribution of the temperature profile after adjustment with an existing ESC design and FIG. 1C shows the temperature differences between FIG. 1A and FIG. 1B illustrating that non-radial locations can't be tuned. As shown in FIG. 1A-FIG. 1C, the ESC design can adjust radial temperature distribution non-uniformity, but fails to adjust non-radial non-uniformity appropriately, and may lead to an even greater variation range of temperature. Furthermore, the existing cooling system can not provide adequate temperature control accuracy.

SUMMARY OF THE INVENTION

In view of the above problems, the present invention is proposed.

An object of the present invention is to provide a technical solution comprising an electrostatic chuck for holding a wafer.

According to a first aspect of the present invention, there is provided an electrostatic chuck, comprising an insulating layer for supporting a wafer and a lamp array disposed in the insulating layer.

Preferably, each lamp of the lamp array is provided with independent control of its on/off function and/or its output power.

Preferably, the electrostatic chuck further comprises a lamp array controller electrically connected to the lamp array for independently controlling the on/off function and/or the output power of each lamp in the lamp array.

Preferably, the electrostatic chuck further comprises temperature detectors for detecting the temperatures of different locations of the wafer held on the electrostatic chuck. The lamp array controller is coupled to the temperature detectors and is used to control the on/off function and/or the output power of each lamp of the lamp array according to the temperatures sensed by the temperature detectors.

Preferably, the temperature detectors are distributed across the electrostatic chuck in a predefined pattern.

Preferably, each lamp has a maximum output power of 300-500 W, and a thermal efficiency of 45%-55%.

Preferably, the lamp array is a honeycomb, a matrix or a linear array.

Preferably, the electrostatic chuck further comprises a fluid cooling system arranged in the electrostatic chuck.

According to another aspect of the present invention, there is provided a reaction apparatus for processing a wafer, comprising a chamber, said electrostatic chuck mounted in the chamber for supporting wafers.

According to still another aspect of the present invention, there is provided a method of wafer temperature control, comprising determining output parameters for each lamp of a lamp array of an electrostatic chuck, the lamp array being disposed in an insulting layer for supporting a wafer on the electrostatic chuck, the parameters comprising the on/off function and/or the output power and controlling each lamp of the lamp array according to the output parameters of each lamp to control the wafer temperature.

Preferably, the on/off function and/or the output power of each lamp of the lamp array can be independently controlled.

Preferably, the method further comprises detecting the temperatures of different locations on the wafer held on the electrostatic chuck, determining a temperature compensation profile according to the temperatures of the different locations on the wafer and determining the output parameters for each lamp of the lamp array of the electrostatic chuck. The output parameters for each lamp of the lamp array of the electrostatic chuck are determined according to the temperature compensation profile.

Preferably, detecting the temperatures of different locations on the wafer held on the electrostatic chuck comprises detecting the temperatures of predefined pattern locations of the wafer held on the electrostatic chuck.

Preferably, each lamp has a maximum output power of 300-500 W, and a thermal efficiency of 45%-55%.

Preferably, the lamp array is a honeycomb, a matrix or a linear array.

Preferably, the method further comprises controlling the wafer temperature through a fluid cooling system arranged in the electrostatic chuck in combination with the lamp array.

An advantage of the present invention is that more accurate wafer temperature control can be achieved through controlling the lamp array on the electrostatic chuck.

Another advantage of the present invention is that non-radial non-uniformity can be improved through independent control of the lamp array of the electrostatic chuck.

Further features of the present invention and advantages thereof will become apparent from the following detailed description of exemplary embodiments of the present invention with reference to the attached drawings.

BRIEF DESCRIPTION OF THE DRAWINGS

The accompanying drawings, which are incorporated in and constitute a part of the specification, illustrate embodiments of the invention and, together with the description, serve to explain the features of the invention.

The present invention can be understood more clearly from the following detailed description with reference to accompanying drawings, in which.

DESCRIPTION OF THE EMBODIMENTS

Figure 1A:
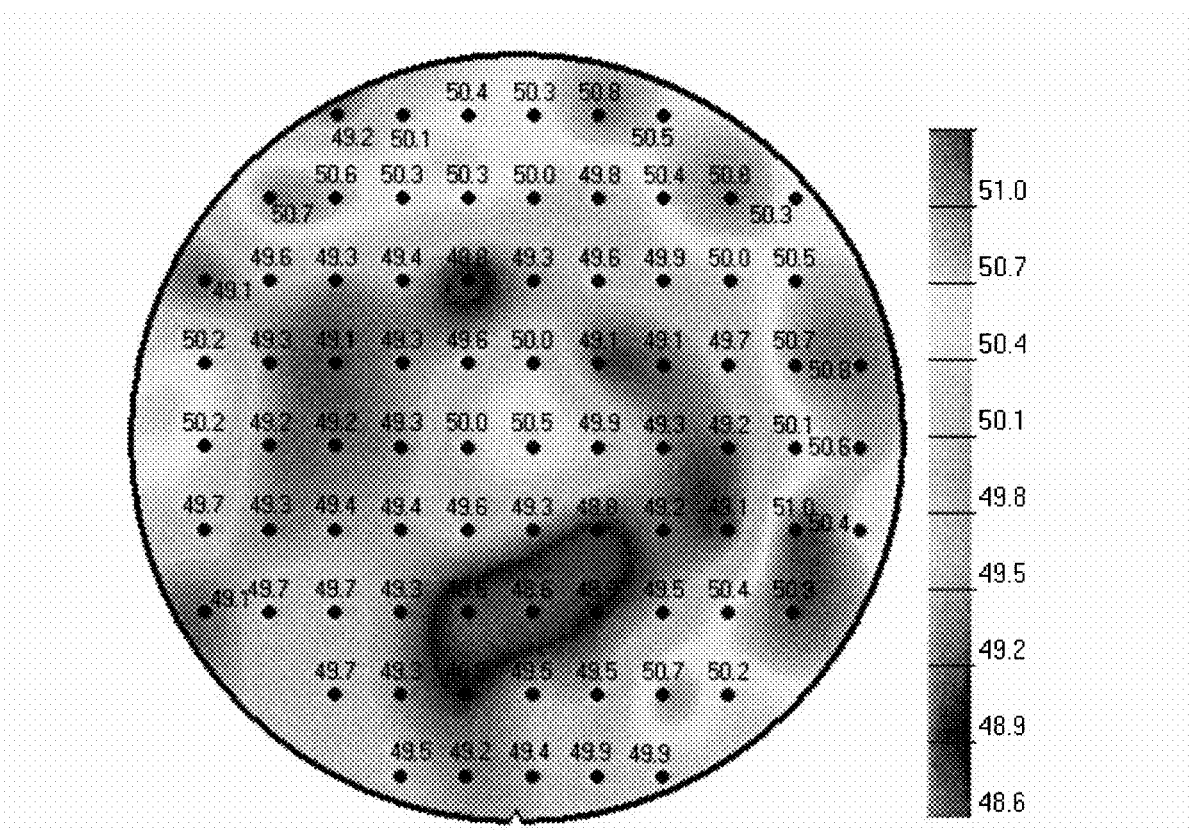
FIG. 1A-FIG. 1C are diagrams of wafer temperature compensation based on a ring type multi-zone cooling system in the prior art.
Figure 1B:
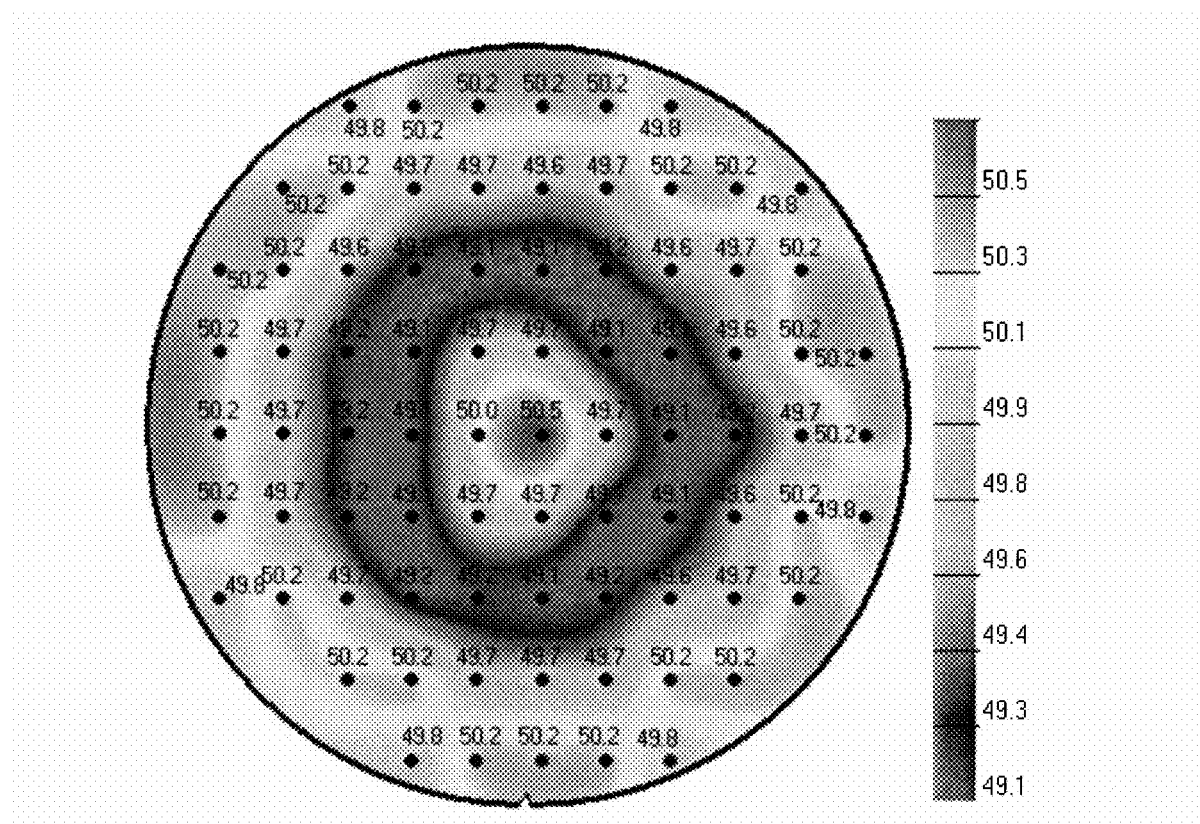
Figure 1C:
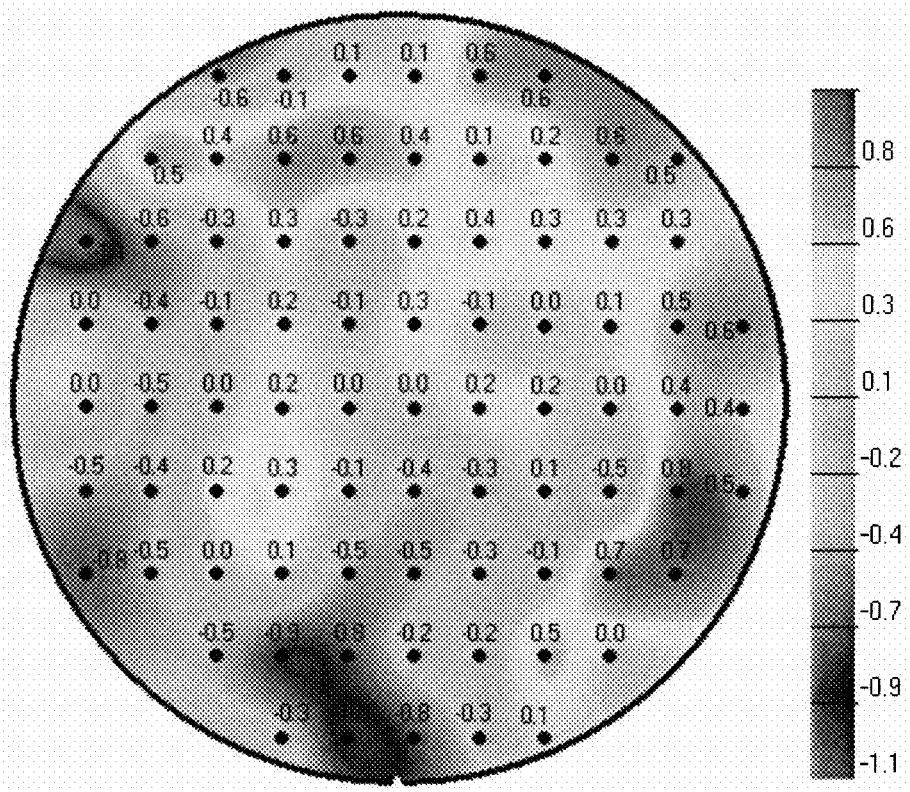

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

Meanwhile, it should be appreciated that various parts in the accompanying drawings are not shown to scale for the convenience of illustration.

The following description of at least one exemplary embodiment is merely illustrative in nature and is not intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

The essential concept of the present invention is to provide a lamp array embedded in an ESC, and achieve wafer temperature control through a fluid cooling system in combination with the lamp array.

Figure 2A:
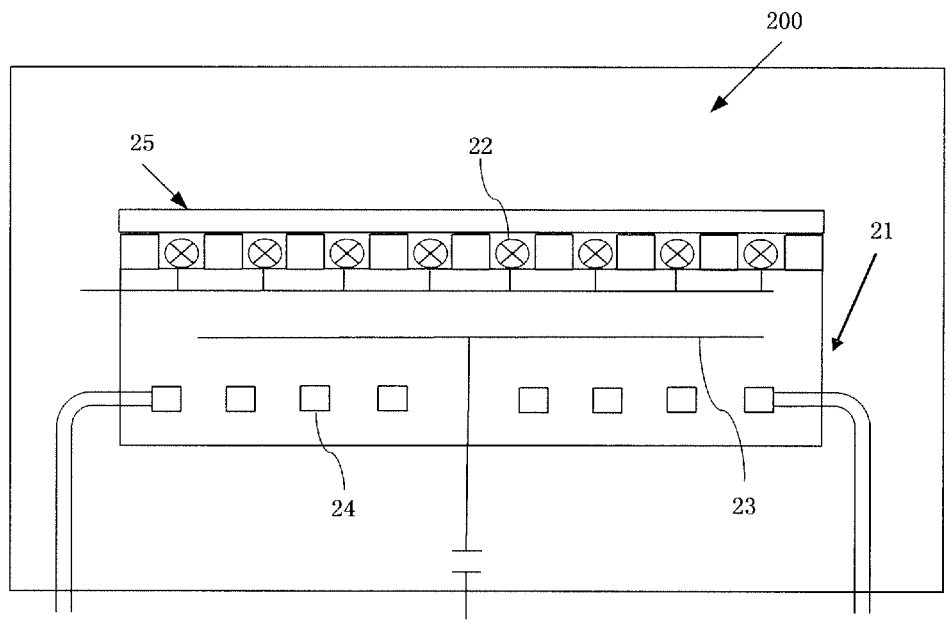
FIG. 2A is a schematic diagram of one embodiment of a reaction apparatus for processing a wafer incorporating features of the present invention.

FIG. 2A is a structural diagram of one embodiment of a reaction apparatus for processing a wafer according to the present invention. As shown in FIG. 2A, the reaction apparatus of this embodiment comprises a chamber 200 and an electrostatic chuck 21 for supporting a wafer 25 therein. The electrostatic chuck 21 has an electrode plate or conductive gate 23 internally for applying a DC voltage from an ESC power source, and holding the wafer 25 by a coulomb force or a Johunsen-Rahbek force produced by the applied DC voltage. The electrostatic chuck 21 generally is equipped with a fluid cooling system, comprising, for example, a ring type multi-zone coolant compartment 24 extending along the perimeter direction, a coolant (such as cooling water, liquid He, etc) at a defined temperature is circularly provided to the coolant compartment 24 from an ESC cooler (not shown) via a coolant dispersion tube, to control treatment temperature for the wafer 21 held on the ESC by means of the temperature of the coolant. The electrostatic chuck 21 comprises an insulating layer for supporting the wafer and a lamp array 22 in the insulating layer. Each lamp of the lamp array 22 can be independently controlled to be turned on/off and/or to vary the output power from off to full on. In cooperation with the fluid cooling system, the temperature of the wafer 21 held on the ESC can be adjusted by turning the lamps on/off and/or controlling output power of each lamp of the lamp array 22, so that temperature non-uniformity can be more favourably adjusted, greatly improving wafer high temperature uniformity and alleviating non-radial temperature non-uniformity.

Those skilled in the art can understand that each lamp of the lamp array of the ESC can be independently controlled, thereby, wafer temperature can be better controlled at various locations and in various directions, resulting in better wafer temperature uniformity. In addition to the combination with a traditional fluid cooling system, the lamp array can also be used in connection with any other cooling system, or can be used independently for controlling wafer temperature.

Figure 2B:
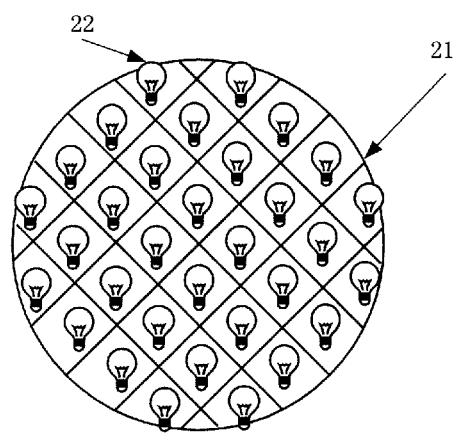
FIG. 2B is a top view of a lamp array in an ESC according to one embodiment of the present invention.

The ESC lamp array 22 may have multiple arrangements, such as, honeycomb arrangement, matrix arrangement or a linear array. FIG. 2B is a top view of a lamp array in the ESC according to one embodiment of the present invention. In this embodiment, the lamp array 22 of the ESC 21 has a honeycomb arrangement.

Figure 3A:
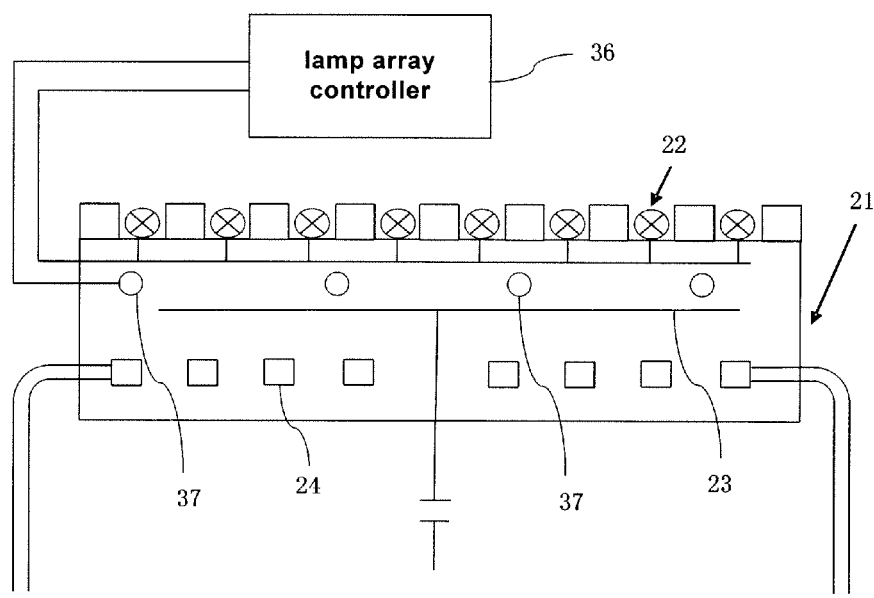
FIG. 3A is a structural diagram of one embodiment of the ESC according to the present invention.

FIG. 3A is a structural diagram of one embodiment of the ESC incorporating features of the present invention. As shown in FIG. 3, the ESC 21 further comprises a lamp array controller 36 electrically connected to the lamp array 22, the lamp array controller 36 can independently control turning the lamp on and off and/or to vary the output power from off to full on for each lamp of the lamp array 22. The ESC 21 further comprises multiple temperature detectors 37 disposed therein for detecting the temperatures of different locations of the wafer held on the ESC. The lamp array controller 36 is coupled to the temperature detectors 37, and controls turning on and off and/or the output power for each lamp of the lamp array 22 in response to the temperatures detected by the temperature detectors 37 and expected temperatures that are inputted, so that wafer temperature uniformity can be better controlled. According to one embodiment of the present invention, the temperature detectors 37 are distributed in the ESC in a predefined pattern. For example, the distribution of those temperature detectors may coincide with the arrangement of the lamps to achieve detection and control for each small area. In one embodiment, those temperature detectors are located internally to the ESC at about ½ of its cross-sectional height.

In the above embodiments, the lamp array controller controls the output of each lamp of the lamp array according to the temperatures sensed by the temperature detectors; as a result, a better and accurate wafer temperature control can be achieved.

Figure 3B:
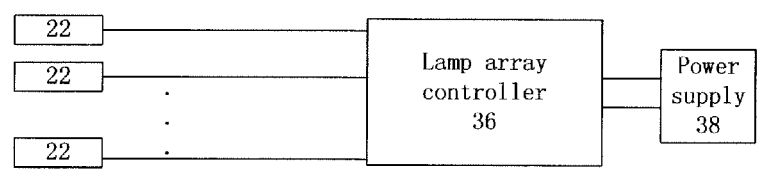
FIG. 3B is a schematic diagram of a lamp array controller circuit of the ESC shown in the embodiment of FIG. 3A.

FIG. 3B is a schematic diagram of a lamp array controller circuit of the ESC shown in the embodiment of FIG. 3A. In FIG. 3B, the lamp array controller 36 is coupled to individual lamps of the lamp array 22 for controlling turning on and off and the output power of each lamp. A power supply 38 is used to supply power to the lamp array controller 36.

Lamps in the lamp array preferably are lamps having higher heat productivity and a rapid on/off response, for example, incandescent lamps, or Xe lamps. In one embodiment, those lamps each have a maximum power of about 300-500 W, a maximum power of 410 W, a thermal efficiency of 45%-50% or 50%-60%. The response speed of those lamps is on the order of milliseconds.

Figure 4:
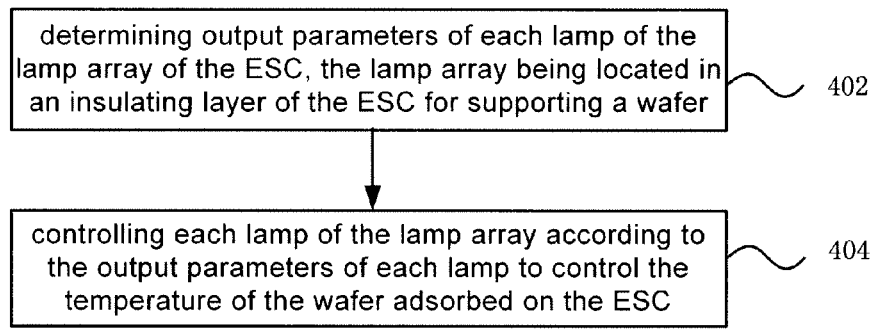
FIG. 4 shows a flowchart of a method for wafer temperature control according to one embodiment of the present invention.

FIG. 4 shows a flowchart of a method of wafer temperature control according to one embodiment of the present invention.

As shown in FIG. 4, at step 402, output parameters of each lamp of the lamp array of the ESC are determined, the lamp array being located in an insulating layer of the ESC designed to support a wafer, the output parameters comprising the on/off function and output power of each lamp. Each lamp of the lamp array can be independently controlled in terms of turning it on and off and the output power.

At step 404, each lamp of the lamp array is controlled according to the output parameters of each lamp to provide heat to control the wafer temperature.

Figure 5:
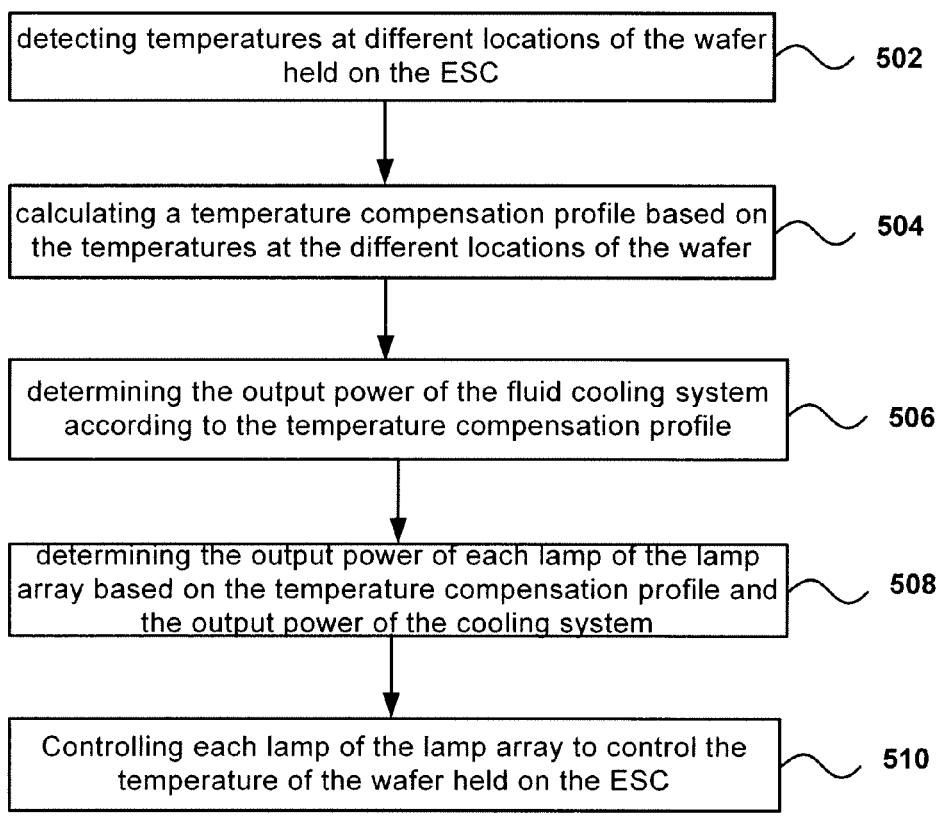
FIG. 5 shows a flowchart of a method for wafer temperature control according to another embodiment of the present invention.

FIG. 5 shows a flowchart of a method for wafer temperature control according to another embodiment of the present invention.

As shown in FIG. 5, at step 502, temperatures at different (key) locations of the wafer held on the ESC are detected. A temperature distribution profile is obtained for the whole wafer based on the temperatures of different locations.

At step 504, a temperature compensation profile is calculated based on the temperatures at the different locations of the wafer.

At step 506, the output power of the fluid cooling system is determined according to the temperature compensation profile.

At step 508, the output power of each lamp of the lamp array is determined based on the temperature compensation profile and the output power of the cooling system.

At step 510, each lamp of the lamp array is activated to control the temperature of the wafer held on the ESC at a predefined temperature distribution.

Figure 6:
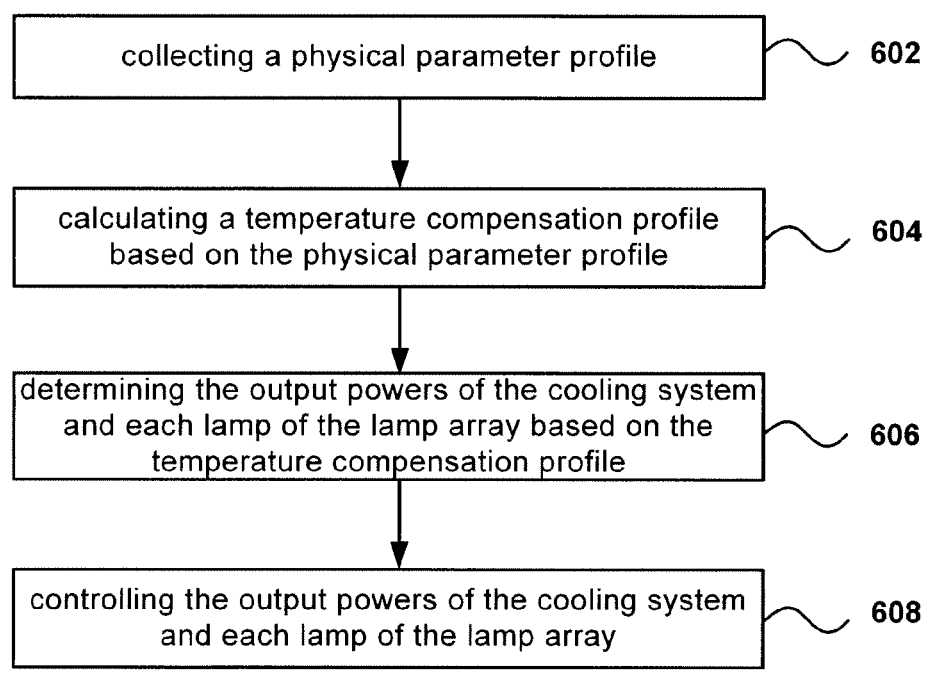
FIG. 6 shows a flowchart of a method for wafer temperature control according to still another embodiment of the present invention.

FIG. 6 shows a flowchart of a method for wafer temperature control according to still another embodiment of the present invention.

As shown in FIG. 6, at step 602, a physical parameter profile is generated. By selecting an intended (or important) pattern, CD measurement is carried out for all dies produced from a whole wafer, and a CD distribution profile is obtained for the whole wafer by drawing with software based on the CD measurement results. The CD measurement equipment can be a measurement machine, for example, CDSEM or OCD.

At step 604, a temperature compensation profile is calculated based on the physical parameter profile. A work curve of the cooling system is prepared, and the relationship between ESC temperature and CD is established for key steps (for example, etching); based on the physical parameter profile, deviations from values defined is calculated, and temperature values to be adjusted are calculated through the work curve to obtain a compensation profile.

At step 606, the output powers of the cooling system and each lamp of the lamp array are determined based on the temperature compensation profile.

At step 608, the output powers of the cooling system and each lamp of the lamp array are controlled.

Figure 7A:
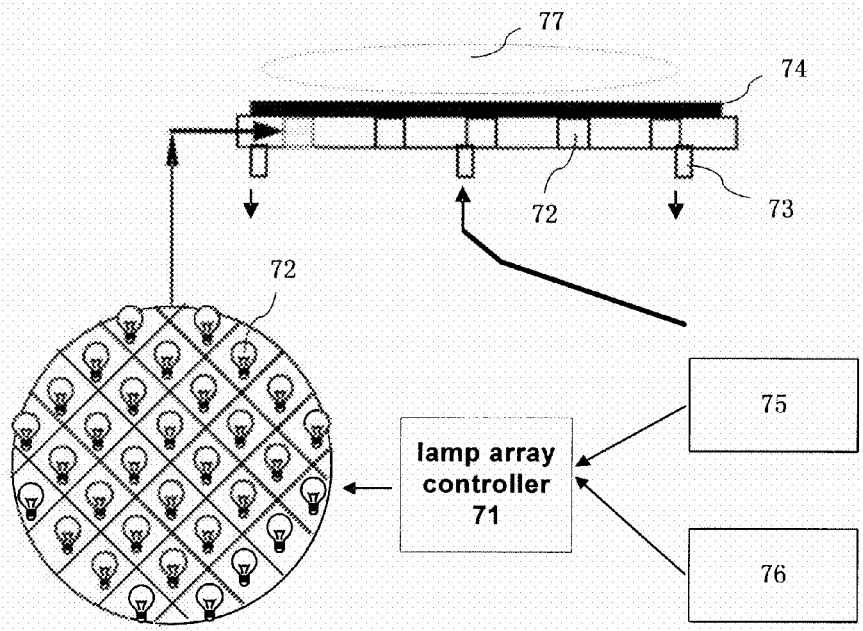
FIG. 7A shows a schematic diagram of an application example of wafer temperature control according to the present invention.
Figure 7B:
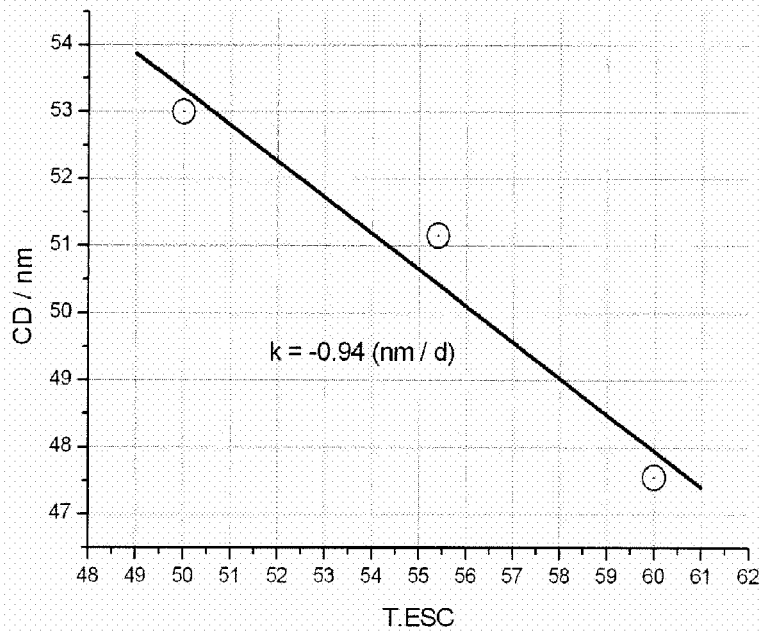
FIG. 7B shows an example of a work curve of CD vs. ESC temperature.
Figure 7C:
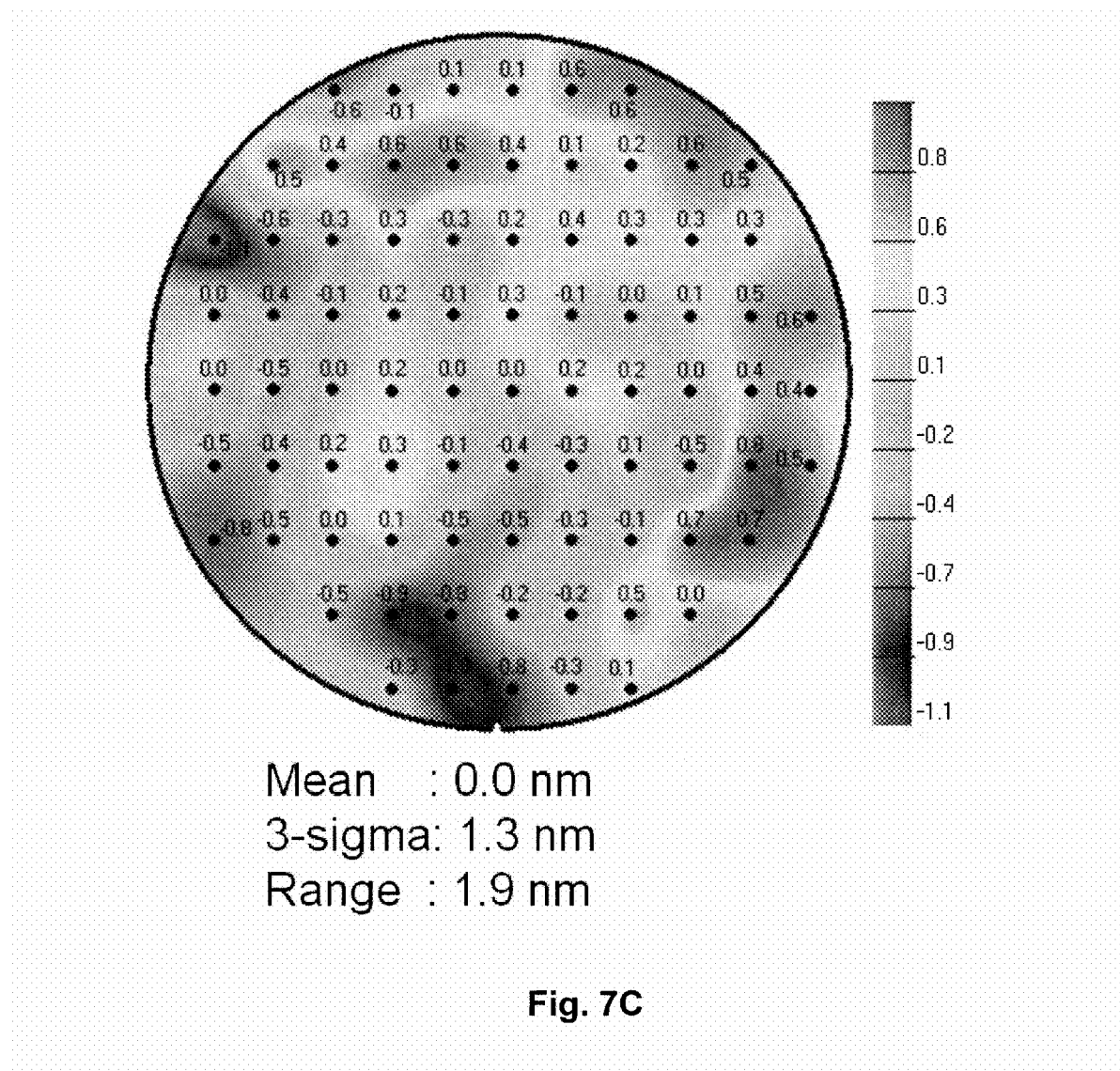
FIG. 7C shows an example of a temperature parameter profile to be compensated.

FIG. 7A shows a schematic operation diagram of the wafer temperature control in the embodiment of FIG. 6. For example, in dry etching, with the continuous bombardment of plasma 77, the temperature of the wafer 74 increases. By clamping the wafer with the ESC, heat is dispersed through a fluid coolant flowing within the cooling system 73 used for controlling the temperature of the wafer 74; an additional heat source is provided by means of the lamps of the lamp array 72. The cooling system 73 is controlled based on the work curve 75; the lamp array controller 71 determines a temperature compensation profile based on the work curve 75 and a temperature parameter profile 76, and controls the output power of each lamp of the lamp array 72. In practice, the temperature of the whole ESC can be appropriately lowered, and the wafer can be heated to a specified temperature through light irradiation from the lamps of the lamp array. FIG. 7B is an example of the work curve 75 in FIG. 7A, and FIG. 7c is an example of a temperature parameter profile 76 to be compensated in FIG. 7A.

Thus, the electrostatic chuck and temperature control method according to this invention have been described in detail. Some details that are well known in the art are not discussed for the purpose of not obscuring the concept of this invention. Based on the above description, those skilled in the art can thoroughly understand how to implement the technique solutions disclosed herein.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the appended claims therefore should be accorded the broadest interpretation so as to encompass all such modifications and similar arrangements and procedures.

What is claimed is:

1. An electrostatic chuck (ESC) for holding a wafer, comprising:
    an insulating layer for supporting a wafer; and
    a lamp array disposed in the insulating layer.

2. The electrostatic chuck according to claim 1, wherein each lamp of the lamp array can be independently controlled to turn on and off or the output power can be adjusted from off to full on.

3. The electrostatic chuck according to claim 1, further comprising a lamp array controller electrically connected to the lamp array for controlling turning each lamp on and off or to adjust the output power of each lamp of the lamp array.

4. The electrostatic chuck according to claim 3, further comprising temperature detectors for detecting the temperatures at different locations of the wafer held on the electrostatic chuck; wherein the lamp array controller is coupled to the temperature detectors and is used to control turning each lamp on and off or to adjust output power of each lamp of the lamp array according to the temperatures detected by the temperature detectors.

5. The electrostatic chuck according to claim 4, wherein the temperature detectors are distributed across the electrostatic chuck in a predefined pattern.

6. The electrostatic chuck according to claim 1, wherein the lamp has a maximum output power of 300-500 W and a thermal efficiency of 45%-55%.

7. The electrostatic chuck according to claim 1, wherein the lamp array is a honeycomb, a matrix, or a linear array.

8. The electrostatic chuck according to claim 1, further comprising a fluid cooling system arranged in the electrostatic chuck.

9. A reaction apparatus for processing a wafer, comprising:
   a chamber; and
   an electrostatic chuck for supporting a wafer, the electrostatic chuck comprising:
      an insulating layer for supporting a wafer; and
      a lamp array disposed in the insulating layer.

10. The reaction apparatus according to claim 9, wherein each lamp of the lamp array can be independently controlled to turn on and off or the output power can be adjusted.

11. The reaction apparatus according to claim 9, further comprising a lamp array controller electrically connected to the lamp array for controlling turning each lamp on and off or to adjust the output power of each lamp of the lamp array.

12. The reaction apparatus according to claim 11, further comprising temperature detectors for detecting the temperatures at different locations of the wafer held on the electrostatic chuck;
   wherein the lamp array controller is coupled to the temperature detectors and is used to control turning each lamp on and off or to adjust output power of each lamp of the lamp array according to the temperatures detected by the temperature detectors.

13. The reaction apparatus according to claim 12, wherein the temperature detectors are distributed across the electrostatic chuck in a predefined pattern.

14. The reaction apparatus according to claim 9, further comprising a fluid cooling system arranged in the electrostatic chuck.

15. A method of wafer temperature control, that method comprising:
   determining output parameters for each lamp of a lamp array in a electrostatic chuck for supporting a wafer, the lamp array being disposed in an insulting layer of the electrostatic chuck, the parameters thereof comprising turning each lamp on and off and varying the output power of each lamp;
   each lamp of the lamp array being controlled according to the output parameters of each lamp to in turn control wafer temperature.

16. The method according to claim 15, wherein each lamp of the lamp array can be independently controlled to turn on and off and adjust the output power of each lamp.

17. The method according to claim 15, further comprising:
   detecting the temperatures at different locations on the wafer held on the electrostatic chuck;
   determining a temperature compensation profile according to the detected temperatures at the different locations on the wafer;
   wherein the output parameters for each lamp of the lamp array of the electrostatic chuck are determined according to the temperature compensation profile.

18. The method according to claim 17, wherein detecting the temperatures at different locations of the wafer held on the electrostatic chuck comprises:
   detecting the temperatures at predefined pattern locations of the wafer held on the electrostatic chuck.

19. The method according to claim 15, wherein the lamp has a maximum output power of 300-500 W, and a thermal efficiency of 45%-55%.

20. The method according to claim 15, wherein the lamp array is a honeycomb, a matrix or a linear array.

21. The method according to claim 15, further comprising:
   controlling wafer temperature through a fluid cooling system arranged in the electrostatic chuck in combination with the lamp array.

* * * * *

UNITED STATES PATENT AND TRADEMARK OFFICE
CERTIFICATE OF CORRECTION

| | | |
|---|---|---|
| PATENT NO. | : 8,952,297 B2 | |
| APPLICATION NO. | : 13/351741 | |
| DATED | : February 10, 2015 | |
| INVENTOR(S) | : Qiyang He et al. | |

It is certified that error appears in the above-identified patent and that said Letters Patent is hereby corrected as shown below:

In the claims:
Claim 15, Col. 8, Line 13, please change [insulting] to --insulating--

Signed and Sealed this
Twenty-first Day of July, 2015

Michelle K. Lee
*Director of the United States Patent and Trademark Office*